United States Patent

[11] 3,632,433

[72] Inventors Takashi Tokuyama
Hoya-shi;
Takaaki Mori, Kokubunji-shi, both of Japan

[21] Appl. No. 716,033
[22] Filed Mar. 26, 1968
[45] Patented Jan. 4, 1972
[73] Assignee Hitachi, Ltd.
Tokyo, Japan
[32] Priorities Mar. 29, 1967
[33] Japan
[31] 42/19093;
Apr. 26, 1967, Japan, No. 42/26325

[54] METHOD FOR PRODUCING A SEMICONDUCTOR DEVICE
13 Claims, 8 Drawing Figs.

[52] U.S. Cl. .................................................... 117/212,
117/215, 117/217, 117/106 A, 29/576, 29/578
[51] Int. Cl. .................................................... H01l 1/10,
H01l 1/14
[50] Field of Search ........................................ 29/576 T,
578, 580, 571; 317/234; 117/212, 217, 106 A, 201

[56] References Cited

UNITED STATES PATENTS

| | | | |
|---|---|---|---|
| 3,200,019 | 8/1965 | Scott et al. .................... | 29/576 T |
| 3,226,612 | 12/1965 | Haenichen .................. | 29/576 T |
| 3,281,915 | 11/1966 | Schramm .................... | 29/578 |
| 3,289,267 | 12/1966 | Ullrich ........................ | 29/576 T |
| 3,312,879 | 4/1967 | Godejahn .................... | 29/578 |
| 3,328,216 | 6/1967 | Brown et al. ................. | 29/578 |

*Primary Examiner*—William L. Jarvis
*Attorney*—Craig, Antonelli, Stewart & Hill

ABSTRACT: A first insulating film of silicon dioxide is provided on the surface of a semiconductor device, and a second silicon dioxide layer containing uniformly a small amount of phosphorus is deposited from the vapor phase on said first insulating film, thereby realizing stable passivation of the electrical characteristics of said semiconductor device. The waterproof property and accurate etching of said films are also accomplished.

INVENTORS
TAKASHI TOKUYAMA
TAKAAKI MORI

BY Craig & Antonelli
ATTORNEYS

INVENTORS
TAKASHI TOKUYAMA
TAKAAKI MORI

BY Craig & Antonelli
ATTORNEYS

INVENTORS
TAKASHI TOKUYAMA
TAKAAKI MORI

BY Craig & Antonelli
ATTORNEYS

INVENTORS
TAKASHI TOKUYAMA
TAKAAKI MORI

BY Craig & Antonelli
ATTORNEYS

METHOD FOR PRODUCING A SEMICONDUCTOR DEVICE

BACKGROUND OF THE INVENTION

Field of the Invention

The present invention relates to semiconductor devices, and more particularly to an effective passivation film for semiconductor devices.

DESCRIPTION OF THE PRIOR ART

It is widely practical to form a semiconductor device such as a diode, a transistor and an integrated circuit (IC) in the following manner. Namely, an $SiO_2$ film is provided on a semiconductor substrate, and the photoresist technique is applied to the $SiO_2$ film to make at least one hole or window having a prescribed form. A P-type or N-type impurity is diffused into the semiconductor substrate through the hole to form one or more PN-junctions extending to the surface. Specifically, a device obtained by the technique of selective impurity diffusion is called a planar-type semiconductor device.

In a semiconductor device of this type the PN-junction exposed at the surface of the substrate is covered with an $SiO_2$ film. So, the electrical characteristics are extremely stable compared to those of a semiconductor device whose substrate is left exposed.

The $SiO_2$ film on the surface of the semiconductor substrate is formed by a known technique. The present method used for forming the film on a silicon substrate is thermal oxidation of the substrate surface. The pyrolysis method of monosilane or organooxysilane is also used. Other methods are sputtering, vacuum evaporation, anodic oxidation, etc.

Generally, the $SiO_2$ film used for the selective diffusion of impurity into the semiconductor substrate remains as a passivation film for the substrate. However, since the $SiO_2$ film used as a diffusion mask is contaminated by the impurity, it is in some cases removed after a given impurity is selectively diffused into the semiconductor substrate. Then a new clean $SiO_2$ film is coated on the semiconductor surface as a passivation film.

When the material of the substrate of the semiconductor device is other than silicon, the $SiO_2$ passivation film is obtained usually by the pyrolysis method of monosilane or organooxysilane.

When an $SiO_2$ film is provided on the substrate of a semiconductor device, a contaminant ion such as $Na^+$ which is mobile by the electric field is introduced during the process of forming the $SiO_2$ film. It is known that the contaminant ion in the $SiO_2$ film, the charge brought about by the structural defect existing in the Si–$SiO_2$ interface, and mobile ions in the $SiO_2$ film are responsible for the tendency of the surface of the silicon substrate to become N-type (which is referred to as an N-type channel). Specifically, the mobile ions which produce an electric field in $SiO_2$ film cause a large variation in the N-type tendency when the temperature rises higher than 200° to 300° C. In order to eliminate such unstable electrical characteristics the mobile ions of this type should be decreased. If the oxidation process of the silicon surface is performed in a highly cleaned environment, it is possible to obtain a semiconductor device with the $SiO_2$ film hardly influenced by temperature and electric field.

Generally in the case of a planar transistor and an integrated circuit, the final product cannot be obtained without experiencing unclean processes such as diffusion, photoresist and electrode formation.

Consequently, however clean the initial oxidation process may be made, $SiO_2$ remaining on the surface of the final product does not maintain a pure state. A temperature rise during the operation of the transistor and integrated circuit and the electric field leaking into $SiO_2$ from the end portion of the junction cause the mobile ions in $SiO_2$ to migrate and change the surface properties. Therefore, the physical quantities influenced by the surface properties, such as the current amplification factor, the reverse current of the junction, and the reverse breakdown voltage, change. In order to prevent such phenomena it is proposed to diffuse phosphorus pentoxide ($P_2O_5$) into part of the surface layer of the $SiO_2$ film covering the surface of the device to form an $SiO_2$ layer containing phosphorus. (This layer is generally called a phosphosilicate glass layer. In the specification hereinafter an $SiO_2$ layer containing phosphorus will be referred to as a phosphosilicate glass layer.) The gettering action of $P_2O_5$ immobilizes Na ions in $SiO_2$.

As described in detail in the Japanese Pat. Publication No. 12178/1966 by IBM of the U.S.A., $POCl_3$ and $PH_3$, etc. are made to react with the surface of $SiO_2$ film in an oxidizing atmosphere at a high temperature near 1,000° C. for several hours to diffuse $P_2O_5$ into the surface of the $SiO_2$ film.

In this case although the stabilization of surface properties is rather good, large disadvantages follow. The first is that the diffusion of $P_2O_5$ into the $SiO_2$ film requires a high temperature and a long period of time. So, the impurity diffused in the semiconductor substrate diffuses again during the $P_2O_5$ diffusion and changes the electrical characteristics of the semiconductor substrate. The second is that when the $SiO_2$ film has an extremely large concentration of phosphorus it begins to have the hygroscopic property. So, the passivation against external atmosphere, especially moisture, becomes considerably poor. In order to obviate this disadvantage a heat treatment is applied to diffuse phosphorus out of the surface of the phosphosilicate glass layer and to decrease to some degree the concentration of phosphorus in the $SiO_2$ surface. In this case the heat treatment requires also a high temperature and a long period of time. The third is that the phosphosilicate glass layer thus obtained is liable to be eroded by an etching solution, e.g. HF, for the oxide film. The inventors have found after investigations that the etching speed of the glass layer by such an etching solution increases exponentially with the amount of $P_2O_5$ contained in $SiO_2$.

In the said Japanese Pat. Publication No. 12178/1966 it is described that the composition of the phosphosilicate glass layer thus obtained is $P_2O_5 \cdot SiO_2$. Its etching speed by the P-etching solution (e.g. $HF:HNO_3:H_2O$=15:10:300 by volume), which is one of the etching solutions for oxide films widely used in semiconductor engineering, is very rapid, i.e. 200 to several hundred A./sec. at room temperature. On the other hand, the $SiO_2$ film formed by the high-temperature thermal oxidation of silicon substrate has a very slow etching speed, i.e. only 2 A./sec. In such a double-layer structure consisting of the phosphosilicate glass layer and the $SiO_2$ layer having high and low etching speeds respectively it is substantially hard to make a through hole with micron order accuracy by the well-known photoresist technique due to the occurrence of the side-etching phenomenon. Namely, while the $SiO_2$ layer is etched, the phosphosilicate glass layer is etched in the lateral direction to a large degree.

According to the research by the inventors, it is found that if one $P_2O_5$ molecule traps one Na ion in the ratio of 1:1, the above-mentioned phosphosilicate glass having such a high concentration of phosphorus is unnecessary. Even a much lower concentration of $P_2O_5$ is sufficient to keep a stable characteristic. The inventors have tried to reduce the concentration of phosphorus in a $POCl_3$ atmosphere and decrease the temperature of the introduction treatment of phosphorus as much as possible. Although $P_2O_5$ in $SiO_2$ can be decreased to 5 to 10 mole percent, the etching speed of the phosphosilicate glass layer by the above-mentioned etching solution is still about 200 A./sec., which is about 100 times as fast as that of the $SiO_2$ film. So the side-etching phenomenon cannot be totally eliminated.

SUMMARY OF THE INVENTION

One object of this invention is to provide a novel method of producing a semiconductor device having a phosphosilicate glass film on the $SiO_2$ film covering the surface of a semiconductor substrate.

Another object of this invention is to provide a novel method of producing a semiconductor device having a phosphosilicate glass layer of a low-phosphorus concentration as a surface passivation film.

Another object of this invention is to provide a novel method of producing a semiconductor device having as a surface passivation film a phosphosilicate glass film free from side etching and capable of accurate treatment in the etching process.

Another object of this invention is to provide a method of producing a semiconductor device having phosphosilicate glass with the waterproof property as a surface passivation film.

Still another object of this invention is to provide a new method of producing a semiconductor device in which the electrical characteristics thereof are stabilized and an accident of short-circuiting among electrode metals occurs hardly.

A further object of this invention is to provide a method of producing a semiconductor device having a passivation film which protects the metal and resistor layers provided on the $SiO_2$ film covering the semiconductor substrate and also stabilizes the electrical characteristics of the semiconductor device formed on the semiconductor substrate.

Essentially this invention consists in the following two points, namely depositing on the surface of an $SiO_2$ layer a mixture layer (i.e. phosphosilicate glass layer) of $P_2O_5$ and $SiO_2$ by means of the vapor phase reaction so as to keep the concentration of phosphorus in the phosphosilicate glass layer below a certain limit, and thereafter heating the structure thus constituted for a short time at a temperature higher than the deposition temperature of phosphosilicate glass.

As described before, according to the conventional well-known method of forming a phosphosilicate glass layer on the $SiO_2$ film surface, by the reaction of $P_2O_5$ vapor with the $SiO_2$ film surface at about 1,000° C. in the oxidizing atmosphere, it is impossible to decrease the concentration of phosphorus in the phosphosilicate glass layer. According to this invention, when $SiO_2$ is formed by a low-temperature reaction using for example the following reaction, $$SiH_4+2O_2 \rightarrow SiO_2+2H_2O,$$

an extremely small amount of $P_2O_5$ is mixed preliminarily with $SiO_2$ using for example $PH_3$ gas. So, an $SiO_2$ ($P_2O_5 \cdot SiO_2$) layer containing phosphorus is deposited on the surface of the $SiO_2$ layer covering the surface of the semiconductor substrate. It is seen, therefore, that according to this invention phosphosilicate glass can be made at 250° to 550° C. which is much lower than that in the conventional method. So, P- and N-type impurities introduced in the semiconductor substrate do not diffuse again, and the electrical characteristics do not vary with the formation of phosphosilicate glass.

Another difference between the inventive method and the conventional method is that the distribution of phosphorus in the phosphosilicate glass layer is different. In the case of the conventional method the concentration of phosphorus is extremely large at the surface and decreases exponentially toward the interior of the phosphosilicate glass layer while in the case of the inventive method it is uniform throughout the deposited phosphosilicate glass layer or it is arbitrarily adjustable, the etching speed of the glass layer being able to be controlled largely by the concentration of phosphorus and the heat treatment after deposition.

In this invention the etching speed of the phosphosilicate glass layer by the P-etching solution is selected to be lower than 10 A./sec. at room temperature or preferably lower than 5 A./sec. It is proved that the phosphosilicate glass whose etching speed is within the above limit has an excellent waterproof property.

Further, according to this invention the above constitution is subjected to heat treatment for a short time. This means that it does not only control the etching speed but also stabilizes the surface properties of the semiconductor substrate. Care has to be taken so that phosphorus in the phosphosilicate glass may diffuse into the $SiO_2$ layer during the thermal treatment but may not cause it to penetrate toward the semiconductor surface.

In this specification the stabilization of the silicon surface properties will be expressed in terms of $N_{FB}$ ($cm^{-3}$) which corresponds to the negative charge density induced on the semiconductor surface, namely the variation $\Delta N_{FB}$ of $N_{FB}$ occurred when subjected to the so-called BT treatment (bias temperature treatment), which is a heat treatment effected in the state of a bias voltage being applied between the $SiO_2$ film and the semiconductor. The measured value of $N_{FB}$ is estimated from $V_{FB}$ showing the inflexion point of the voltage-capacitance characteristic of an MOS device (metal oxide semiconductor device), which corresponds to the voltage applied externally to the MOS-type device in the reverse direction to cancel the negative surface charge, $\Delta V_{FB}$ being the variation due to the BT treatment. The BT treatment consists of the application of an electric field of $10^5$ to $10^6$ v./cm. and a simultaneous heat treatment at 200° C. for 60 minutes. The direction of the applied electric field is selected so that the metal electrode of the MOS-type device becomes positive. So, if there are positive ions such as Na ions in $SiO_2$ film, they are collected to the silicon surface and cause an increase in $N_{FB}$ ($\Delta N_{FB}>0$).

In the embodiment of this invention described hereinbelow the concentration of phosphorus in the phosphosilicate glass layer and the temperature of heat treatment after the formation of the phosphosilicate glass are so selected that $\Delta V_{FB}$ is less than 10 v., or generally nearly zero. When $\Delta v_{FB}=0$, the surface properties are independent of stress due to temperature and electric field, which is the most favorable state.

DESCRIPTION OF THE PREFERRED EMBODIMENTS

Figure 1:
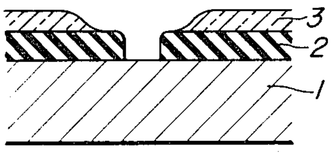
FIG. 1 is a longitudinal sectional view showing schematically the etching state of a publicly known phosphosilicate glass—$SiO_2$ double-structure film.

In FIG. 1 an $SiO_2$ layer 2 is formed on the surface of a silicon substrate 1 by a thermal oxidation method. Then heat treatment is made at about 1,100° C. in an atmosphere of the $POCl_3$ and $O_2$ to diffuse $P_2O_5$ into the surface of $SiO_2$ layer 2 and form a phosphosilicate glass layer 3 thereon. A photoresist technique is applied to the $SiO_2$ layer 2 of the sample thus obtained to form holes reaching the surface of the silicon substrate for the provision of electrodes to the semiconductor device. FIG. 1 shows schematically the shape of the hole. Since the phosphosilicate glass layer 3 formed by the known method has a high concentration of phosphorus, the etching speed thereof is much faster than that of the $SiO_2$ film 2, thereby causing the side-etching phenomenon.

This phenomenon brings about the connection between holes of adjacent regions in a micropattern transistor or in an integrated circuit having a high-density integration of fine patterns. As a result short-circuiting of junctions by the electrodes such as aluminum mounted thereon frequently occurs. This tendency is a crucial problem in a device for high-frequency usage having a microelectrode structure. As a countermeasure, an $SiO_2$ layer is coated on the phosphosilicate glass, or a high-temperature treatment is made just after the formation of phosphosilicate glass to diffuse a certain amount of phosphorus out of the surface portion of the phosphosilicate glass layer. However, these methods are not considered to be sufficient.

In order to obviate such an inconvenience this invention adopts the following method. Namely, the concentration of phosphorus in the phosphosilicate glass layer is reduced. The $SiO_2$ film capable of accurate etching is first perforated. After the formation of electrodes, evaporated leads and resistors which are necessary for the thin film passive element the $SiO_2$ film having a small concentration of phosphorus is coated thereon.

Figure 2:
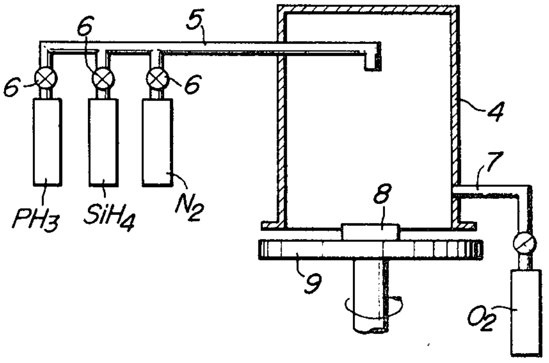
FIG. 2 is a rough diagram of an arrangement forming the phosphosilicate glass used in the embodiment of this invention.

FIG. 2 shows a rough diagram of an arrangement to form an $SiO_2$ film by the oxidation of monosilane ($SiH_4$) and a phosphosilicate glass layer ($P_2O_5 \cdot SiO_2$) by introducing phosphine ($PH_3$) in the above decomposition reaction.

In FIG. 2, 4 is a reaction chamber into which $SiH_4$, $PH_3$ and $N_2$ or Ar, the latter being a carrier gas, are properly introduced through the pipe 5. Cocks 6 adjust the flow rate of gases. Oxygen gas ($O_2$) is introduced through a pipe 7 in a predetermined amount. A semiconductor substrate 8 is mounted on a rotating hotplate 9 whose temperature is adjusted from 250° to 550° C.

The gas flow rates are 600 cc./min. of $SiH_4$ of 4% $N_2$ dilution, 5 e./min. of $N_2$, and 100 cc./min. of $O_2$. The flow rate of $PH_3$ of 0.1% $N_2$ dilution is adjusted between 30 and 1,000 cc./min. in accordance with the desired concentration of phosphorus. The growth rate of the glass layer is 1,000 to 2,000 A./min. When the flow rate of $PH_3$ is zero, a pure $SiO_2$ film grows.

Figure 3:
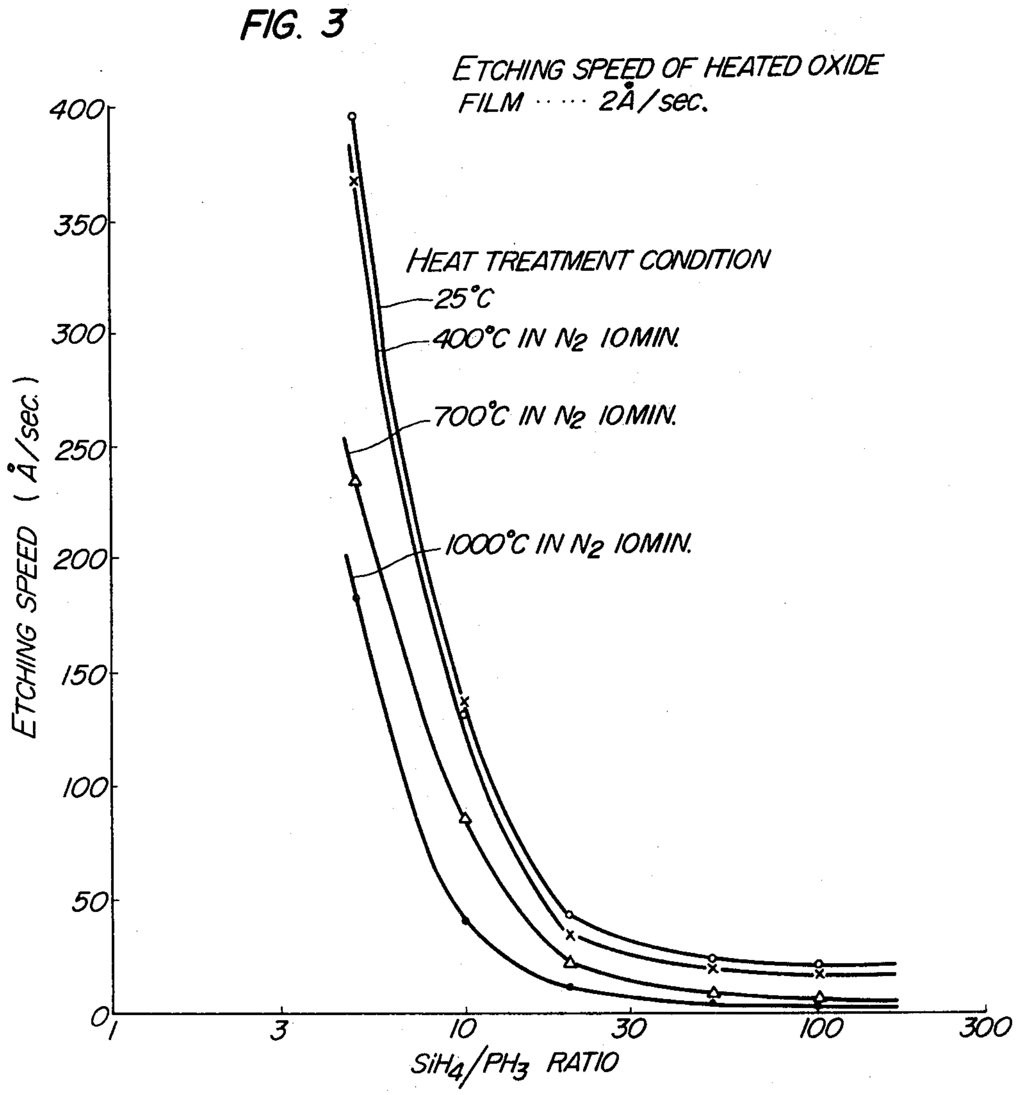
FIG. 3 shows the etching speed of the $SiO_2$ film (phosphosilicate glass film) added with phosphorus as a function of the concentration of phosphorus and the temperature of heat treatment.

FIG. 3 shows the etching speed in the phosphorus-etching solution of the $P_2O_5 \cdot SiO_2$ glass made by the above-mentioned method as a function of the flow rate of $SiH_4/PH_3$ and the heat treatment after deposition. As the ratio of $SiH_4/PH_3$ becomes large or the concentration of phosphorus becomes smaller, the etching speed becomes lower. Also, the higher the temperature of heat treatment after deposition, the more reduced the etching rate. When the diffusion of phosphorus is made by a known high-temperature diffusion method using $POCl_3$, etc., the etching speed is more than 200 A./sec. as described before. It is seen in FIG. 3 that this invention makes it possible to control the etching speed within a wide range.

Figure 4:
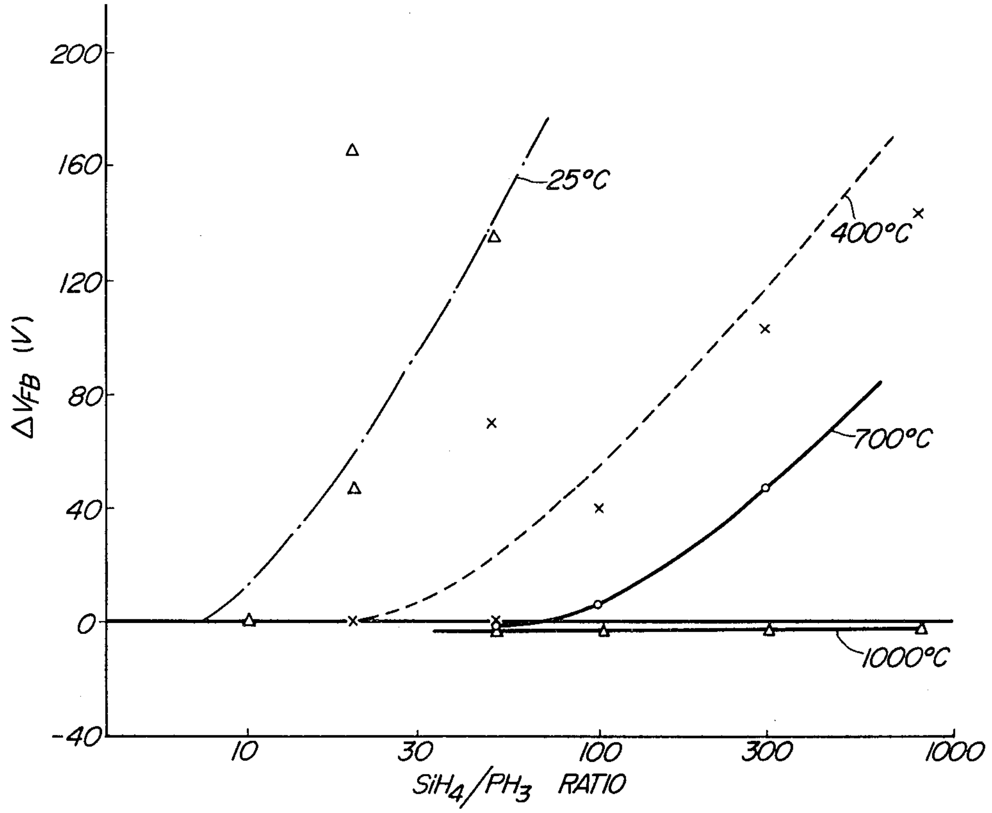
FIG. 4 shows the effect of BT treatment on an MOS-type device having an $SiO_2$ layer (phosphosilicate glass layer) doped with phosphorus.

Next, the stabilization of the surface properties of phosphosilicate glass thus obtained will be explained. A pure $SiO_2$ film of a thickness of 2,500 to 3,000 A. is grown on a (111) surface of a P-type silicon substrate having a resistivity of 100Ω cm. interrupting the supply of $PH_3$. A phosphosilicate ($P_2O_5 \cdot {}^{anSiO}{}_2$) glass layer of 2,500 to 3,000 A. is grown successively thereon with the supply of $Ph_3$. An aluminum electrode is mounted by evaporation on the glass surface to obtain an MOS structure. The difference $\Delta V_{FB}$ before and after the B.T. treatment with application of 30 v. is measured and the result shown in FIG. 4 is obtained, the positive and negative polarities being given to the aluminum electrode and the silicon substrate respectively. In FIG. 4 the characteristic curve of 25° C. is one which is obtained just after the deposition of phosphosilicate glass without heat treatment. 400° 700° and 1,000° C. are the temperatures of the heat treatment. The result shows a general tendency that when the concentration of phosphorus in phosphosilicate glass is high a stable characteristic (a small $\Delta V_{FB}$) is obtained. The stabilization is promoted when the temperature of heat treatment after deposition is high. It is found therefore that the stabilization of surface properties is effected by a small concentration of phosphorus.

Through examination of FIGS. 3 and 4 it is seen that there is a region where the surface properties are stabilized with a small phosphorus concentration of the phosphosilicate glass and an extremely low value of etching speed. With a suitable combination of the concentration of phosphorus and the temperature of heat treatment it is possible to form a phosphosilicate glass layer having a prescribed etching speed and an excellent waterproof property.

Figure 5:
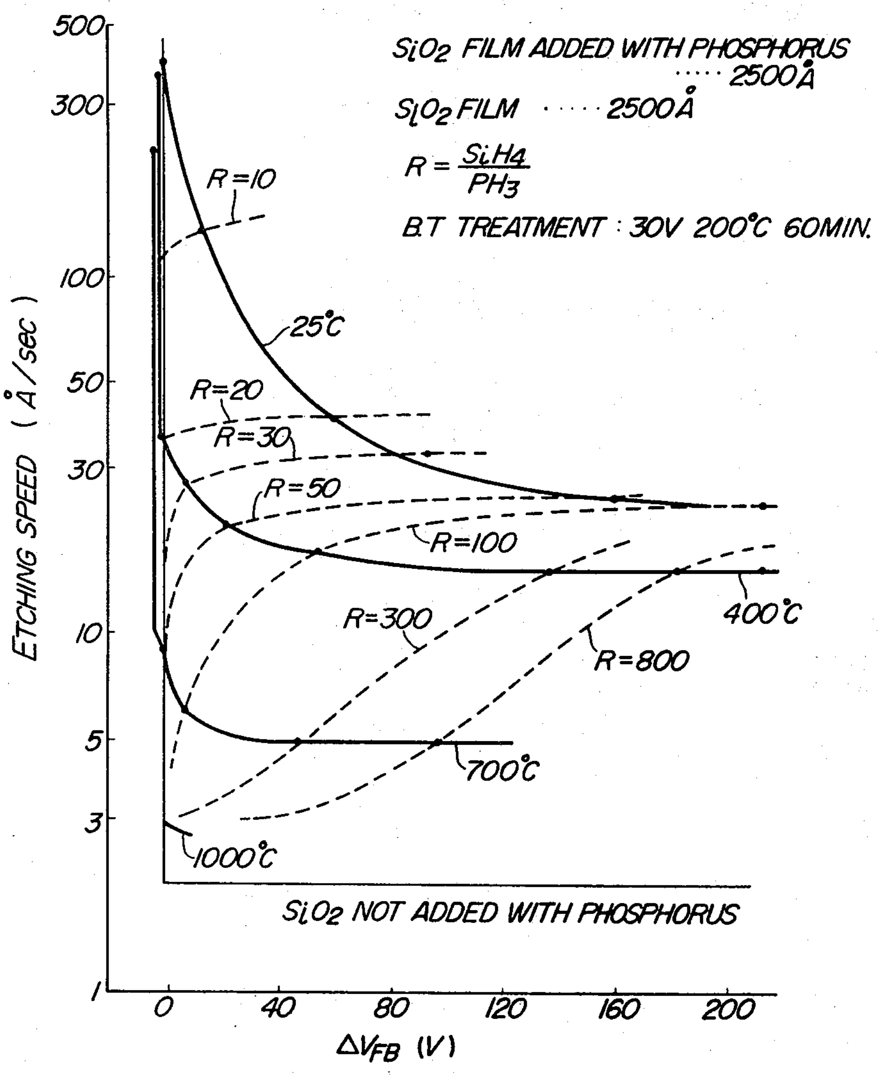
FIG. 5 shows the concentration of phosphorus, the etching speed, and the stabilization effect of the phosphosilicate glass formed by the $SiH_4$ oxidation method. This figure is obtained by rearrangement of FIGS. 3 and 4.

FIG. 5 summarizes the results of FIGS. 3 and 4, which help to understand this invention. The ordinate indicates the etching speed of phosphosilicate glass, and the abscissa indicates the difference of surface properties before and after the B.T. treatment, i.e. the stabilization factor $\Delta V_{FB}$. The solid curves show the characteristics for some temperatures of heat treatment after the deposition of phosphosilicate glass and the dotted curves show the characteristics for some gas flow rates of $SiH_4/PH_3$ which corresponds to the concentration of phosphorus in phosphosilicate glass during the formation of the glass. The conventional method of forming phosphosilicate glass occupies the region where the abscissa is nearly zero and the ordinate is nearly 500 while the invention method occupies the region where the abscissa is nearly zero and the ordinate is less than 10 or particularly less than 5. The merits of this invention consist in the facts that the etching speed can be decreased to about 1/100 maintaining good stabilization and that the waterproof property of phosphosilicate glass is excellent in the above region.

Figure 6:
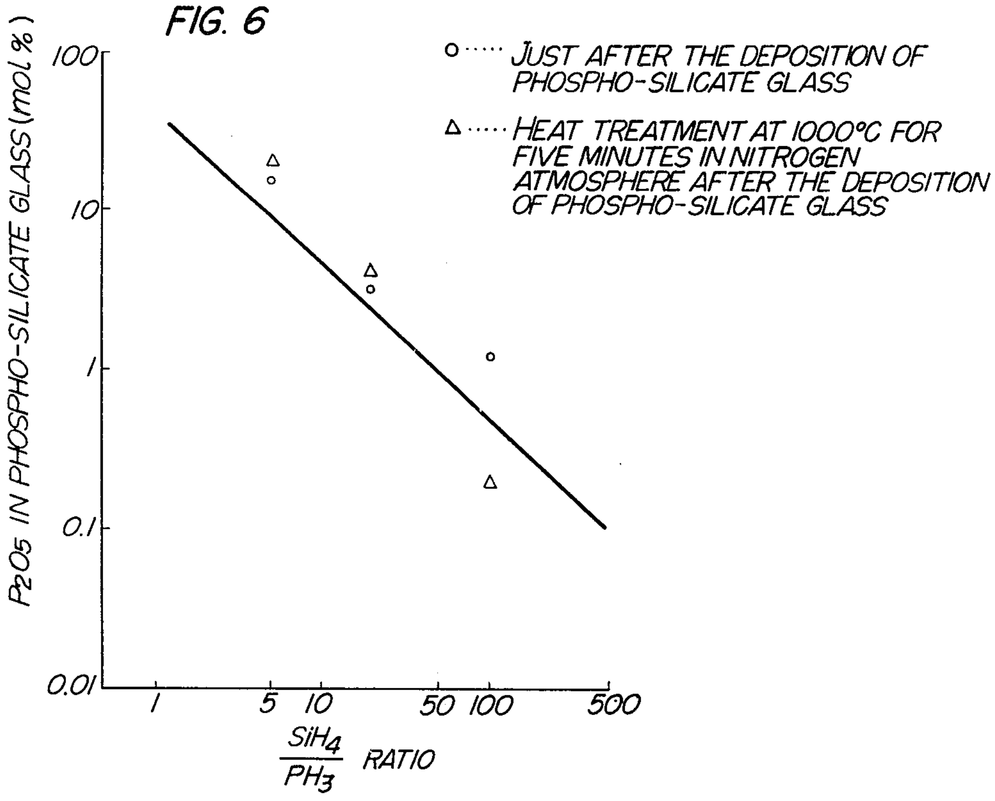
FIG. 6 shows the relationship between the concentration of phosphorus and the reaction gas ratio in the $SiO_2$ layer doped with phosphorus and formed by the oxidation method.

Although the concentration of phosphorus explained in FIGS. 3 and 5 is expressed by the gas flow rate of $SiH_4/PH_3$, the real amount of phosphorus in the $SiO_2$ layer is as shown in FIG. 6, which shows the relationship between the concentration of phosphorus in $SiO_2$ doped with phosphorus by the oxidation method of $SiH_4$ and the reaction gas ratio.

As evident from this figure, the amount of phosphorus in the phosphosilicate glass film is determined substantially uniquely. Namely, the content of phosphorus in the glass having the etching speed of less than 10 A./sec. can be determined from FIG. 6. Actually, however, since the etching speed is a function of the temperature of heat treatment as shown in FIG. 3, it is difficult to determine it only by the amount of phosphorus. The reason is due to the sintering type "densification" phenomenon caused by the heat treatment after the low-temperature deposition of phosphosilicate glass. This phenomenon is inherent only in the low-temperature-deposited glass and will disappear if the addition of low-concentration phosphorus is made possible by a high-temperature treatment. Then the etching speed can be determined only by the concentration of phosphorus.

Although in the above explanation the formation of $SiO_2$ film under the phosphosilicate glass film has been made by the oxidation method of $SiH_4$ for the sake of convenience, it may be made by other methods such as the oxidation method of the silicon substrate at a high temperature or the thermal decomposition method of organooxysilane, e.g. tetraethoxysilane. Moreover, the thickness of $SiO_2$ film need not be equal to that of the phosphosilicate glass layer but may be of such a value (more than 500 A.) that phosphorus may not diffuse by the heat treatment after deposition into the surface of silicon substrate through the $SiO_2$ layer. Then the ratio between the thickness of the $SiO_2$ film and the phosphosilicate glass film more or less deviates from the relations shown in FIG. 5, but the deviation is slight.

Figure 7:
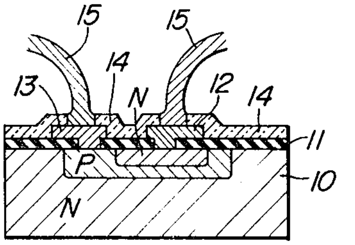
FIG. 7 shows a longitudinal sectional view of a planar-type transistor according to one embodiment of this invention.

An explanation of the application of this invention to a planar-type transistor will be given hereunder. Here the situation is somewhat different from the simultaneous perforation of double structural layers of $SiO_2$ and phosphosilicate glass. As shown in FIG. 7, the $SiO_2$ layer is first perforated accurately and thereafter a desired electrode metal is evaporated to form a semiconductor device. The above process is the same as the conventional planar method. In this embodiment, a phosphosilicate glass layer having a small concentration of phosphorus is deposited to cover entirely the electrode metal. The portion of phosphosilicate glass layer lying on the electrode metal is perforated to evaporate thereon an electrode metal for the external electrode.

The method of producing the planar-type transistor as shown in FIG. 7 is as follows. The temperature of the semiconductor device 10 is adjusted between 300° and 350° C. on the hotplate shown in FIG. 2. When 600 cc./min. of $SiH_4$ of 4% $N_2$ dilution, 5 e./min. of $N_2$, 100 cc./min. of $O_2$ and 2,400 cc./min. of $PH_3$ of 0.1% $N_2$ dilution are passed over the semiconductor device, phosphosilicate glass is deposited on the $SiO_2$ film 11, the emitter electrode 12 and the base electrode 13 at a rate of 2,000 A./min. After a few minutes a phosphosilicate glass thin film of about 500-A. thickness obtained. Desired portions of the phosphosilicate glass thin film 14 (the portions corresponding to the emitter and base electrodes) are selectively etched using the well-known technique. Au lead wires 15 are provided on the selected portions, obtaining thus the semiconductor device as shown in FIG. 7.

Since in this embodiment the semiconductor substrate is heated at 300° to 350° C. in the process of forming phosphosilicate glass, additional heat treatment for introducing phosphorus in the phosphosilicate glass into the $SiO_2$ film is not necessary.

Next, a plurality of conventional planar type $P^+N$- junction silicon diodes are formed as follows. An $SiO_2$ film is provided on the surface of N-type silicon substrate. A portion of the $SiO_2$ film is perforated to diffuse boron therethrough into the silicon substrate to form a $P^+N$-diode. Electrodes are provided on the $P^+$ and N sides.

The inventive method is applied to the diodes thus obtained. Namely, an $SiO_2$ film having a small concentration of phosphorus is provided to cover the existing $SiO_2$ film and the electrode metal. The portion of phosphosilicate glass lying on the electrode metal is removed to provide external electrodes thereon.

Figure 8:
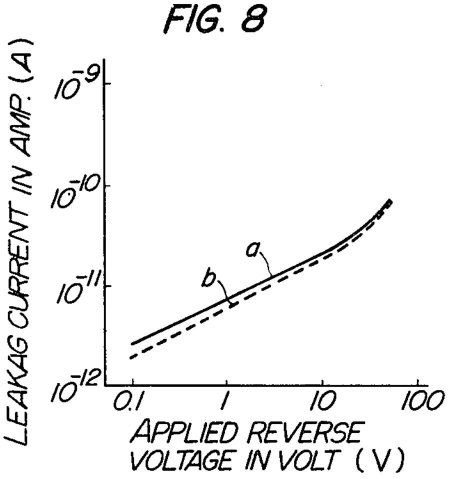
FIG. 8 shows the result of the forced stress life test of an inventive planar-type $P^+N$-junction silicon diode provided with the phosphosilicate glass layer.

A result of forced deterioration tests of the $P^+N$-junction silicon diode thus obtained is shown in FIG. 8.

In this figure, the curve *a* shows the characteristics of leakage current vs. reverse voltage of the $P^+N$-junction silicon diode obtained before the forced deterioration test thereof and the curve *b* shows the characteristics of leakage current vs. reverse voltage of the $P^+N$-junction silicon diode with the phosphosilicate glass thin film obtained after being subjected to the conditions of 200° C. in temperature and 10 v. in reverse voltage for 4 hours.

According to FIG. 8 it is seen that the inventive semiconductor device with a phosphosilicate glass thin film is hard to deteriorate. To the contrary, in the conventional semiconductor device the leakage current usually increases by a few orders of magnitude by said forced deterioration test. The phosphosilicate glass thin film is effective as a passivation film of electrodes. The destruction of electrodes due to a mechanical damage during assembly and usage, an open lead, and a short circuit with adjacent metals are also prevented.

As evident from the foregoing description, since the semiconductor passivation film according to this invention has a low etching speed of about 1/100 times that of the conventional phosphosilicate glass, the stability of the electrical characteristics of the semiconductor device is much improved. Moreover, the inventive phosphosilicate glass, being excellent in waterproof property, is stable against the external atmosphere, particularly moisture.

Therefore, a fine perforation of the order of 2$\mu$ width becomes possible and stabilization of the characteristics of a high-frequency and high-speed transistor and monolithic integrated circuit or hybrid integrated circuit is attained.

In this invention it is possible to insert electrode metals or thin film circuit components such as an evaporated resistor element, e.g. nichrome, and a capacitor element using tantalum oxide between the phosphosilicate glass layer and the underlying $SiO_2$ layer.

Although in the above embodiment the stabilization of an MOS-type device is described with regard to $V_{FB}$, it is needless to say that this method can be applied to the stabilization of a transistor and an integrated circuit. The phosphosilicate glass layer is formed by the above-mentioned method on a semiconductor device after diffusion in the planar process followed by heat treatment, thereby realizing the stabilization of surface properties and forming a semiconductor device having a long life and a high reliability.

We claim:

1. A method of producing a semiconductor device comprising the steps of forming a silicon dioxide layer on a semiconductor element, and exposing said semiconductor element to a gas mixture of silane, oxygen, phosphine and a carrier gas at temperatures of from about 250° to 550° C. to deposit another silicon dioxide layer including phosphorus on the silicon dioxide layer, thereby forming a dual passivation layer.

2. The method of producing a semiconductor device according to claim 1, wherein the carrier gas is selected from the group consisting of nitrogen and argon.

3. The method of producing a semiconductor device according to claim 1, wherein the amount of phosphorus in said another silicon dioxide layer is adjusted by controlling the volume of phosphine in said gas mixture so that said another silicon dioxide layer has an etching rate less than 10 A./min. in an etching solution consisting essentially of 15 parts of hydrofluoric acid, 10 parts of nitric acid and 300 parts of water, by volume.

4. The method of producing a semiconductor device according to claim 1, wherein the thickness of the fresh silicon dioxide layer on the surface of the semiconductor element is more than 500 A.

5. The method of producing a semiconductor device according to claim 4 wherein the thickness of the fresh silicon dioxide layer is 2,500 A. to 3,000 A.

6. The method of producing a semiconductor device according to claim 1, wherein the thickness of said another silicon dioxide layer is 2,000 to 10,000 A.

7. The method of producing a semiconductor device according to claim 1, comprising the step of heating the semiconductor element, after the deposition of said another silicon dioxide layer, to a temperature higher than that at which said another silicon dioxide layer was formed.

8. The method of producing a semiconductor device according to claim 7, wherein the temperature and the period of the heat treatment are such that the phosphorus in said another silicon dioxide layer does not diffuse into the semiconductor element.

9. A method of producing a semiconductor device according to claim 1, wherein the volume ratio of silane to phosphine is at least 50.

10. A method of producing a semiconductor device according to claim 9, comprising the step of heating the semiconductor substrate after the step of forming said another silicon dioxide layer to a temperature higher than that at which said another silicon dioxide layer was formed.

11. The method of producing a semiconductor device comprising the steps of (*a*) forming a silicon dioxide layer on one surface of a semiconductor substrate having at least one PN-junction therein, extending to the surface thereof, (*b*) forming holes exposing the selected portions of said substrate in said layer for producing electrical connections, (*c*) depositing electrode metal through the holes upon the surface of the substrate, (*d*) forming another silicon dioxide layer including phosphorus on the silicon dioxide layer and on the electrode metal by exposing the substrate to a gas mixture of silane, oxygen, phosphine and a carrier gas at temperatures of from about 250° to 550° C.

12. The method of producing a semiconductor device according to claim 11, characterized in that the carrier gas is selected from the group consisting of nitrogen and argon.

13. A method of producing a semiconductor device according to claim 11, comprising the step of heating the semiconductor substrate, after the step of forming said another silicon dioxide layer, to a temperature higher than that at which said another silicone dioxide layer was formed.

* * * * *